US011217529B2

(12) United States Patent
Beyer et al.

(10) Patent No.: US 11,217,529 B2
(45) Date of Patent: Jan. 4, 2022

(54) SEMICONDUCTOR DEVICE AND METHOD OF FORMING A SEMICONDUCTOR DEVICE (71) Applicant: Infineon Technologies AG, Neubiberg (DE)

(72) Inventors: Stefan Beyer, Villach (AT); Marius Aurel Bodea, Villach (AT); Jia Yi Wong, Melaka (MY)

(73) Assignee: Infineon Technologies AG, Neubiberg (DE)

(*) Notice: Subject to any disclaimer, the term of this patent is extended or adjusted under 35 U.S.C. 154(b) by 126 days.

(21) Appl. No.: 16/592,156

(22) Filed: Oct. 3, 2019

(65) Prior Publication Data
US 2020/0111750 A1    Apr. 9, 2020

(30) Foreign Application Priority Data

Oct. 4, 2018 (DE) ...................... 10 2018 124 497.5

(51) Int. Cl.
  *H01L 23/532* (2006.01)
  *H01L 21/768* (2006.01)
  *H01L 23/00* (2006.01)

(52) U.S. Cl.
  CPC .... *H01L 23/53238* (2013.01); *H01L 21/7685* (2013.01); *H01L 23/53223* (2013.01); *H01L 23/53266* (2013.01); *H01L 24/72* (2013.01); *H01L 24/90* (2013.01); *H01L 2924/1301* (2013.01); *H01L 2924/13055* (2013.01); *H01L 2924/13091* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 6,803,667 B2 | 10/2004 | Okura et al. | |
| 7,009,292 B2* | 3/2006 | Miura | H01L 23/4824 257/718 |
| 7,659,611 B2* | 2/2010 | Otremba | H01L 23/3107 257/690 |
| 7,812,432 B2 | 10/2010 | Hou et al. | |
| 8,569,886 B2 | 10/2013 | Tu et al. | |
| 9,059,182 B2 | 6/2015 | Maier et al. | |
| 9,583,482 B2* | 2/2017 | Matocha | H01L 21/046 |
| 9,640,459 B1 | 5/2017 | Tay et al. | |
| 9,786,620 B2 | 10/2017 | Kramp | |
| 10,236,265 B2 | 3/2019 | Kramp et al. | |
| 2007/0287279 A1 | 12/2007 | Daubenspeck et al. | |

(Continued)

*Primary Examiner* — Vongsavanh Sengdara
(74) *Attorney, Agent, or Firm* — Dicke, Billig & Czaja, PLLC (57) ABSTRACT

A semiconductor device and method is disclosed. The semiconductor device may include a semiconductor substrate including an active area, a metal layer structure over the active area, wherein the metal layer structure is configured to form an electrical contact, the metal layer structure including a solder area, a buffer area, and a barrier area between the solder area and the buffer area, wherein, in the barrier area, the metal layer structure is further away from the active area than in the solder area and in the buffer area, and wherein each of the solder area and the buffer area is in direct contact with the active area or with a wiring layer structure arranged between the active area and the metal layer structure.

30 Claims, 8 Drawing Sheets

(56) References Cited

U.S. PATENT DOCUMENTS

| | | |
|---|---|---|
| 2009/0004774 A1 | 1/2009 | Lee et al. |
| 2009/0072397 A1 | 3/2009 | Loo |
| 2009/0302327 A1 | 10/2009 | Rexer et al. |
| 2011/0049723 A1 | 3/2011 | Fayaz et al. |
| 2011/0092000 A1 | 4/2011 | Coffy |
| 2012/0228696 A1* | 9/2012 | Carpenter ............... H01L 24/41 257/329 |
| 2013/0285260 A1* | 10/2013 | Denison .............. H01L 23/4952 257/777 |
| 2014/0061884 A1* | 3/2014 | Carpenter ............... H01L 24/37 257/676 |
| 2014/0240945 A1* | 8/2014 | Hosseini ........... H01L 23/49562 361/782 |
| 2014/0306332 A1* | 10/2014 | Denison ................. H01L 24/38 257/676 |
| 2014/0361419 A1* | 12/2014 | Xue ........................ H01L 24/17 257/676 |
| 2015/0087114 A1* | 3/2015 | Xue ................. H01L 23/49562 438/123 |
| 2015/0214170 A1* | 7/2015 | Chen ....................... H01L 24/05 257/737 |
| 2015/0221731 A1* | 8/2015 | Zeng .................. H01L 29/7395 257/139 |
| 2016/0204057 A1* | 7/2016 | Yato ................. H01L 23/49844 257/684 |

\* cited by examiner

SEMICONDUCTOR DEVICE AND METHOD OF FORMING A SEMICONDUCTOR DEVICE

CROSS-REFERENCE TO RELATED APPLICATION

This Utility Patent Application claims priority to German Patent Application No. 10 2018 124 497.5, filed Oct. 4, 2018, which is incorporated herein by reference.

TECHNICAL FIELD

Various embodiments relate generally to a semiconductor device and to a method of forming a semiconductor device.

BACKGROUND

Using copper (Cu) clips in transistor outline (TO) packages is a fairly recent development, wherein a soft solder, a diffusion solder or a solder paste is used for a clip attach. During the clip attach, a solder coverage (under the clip) is a critical process, which is controlled to ensure that more than approximately 80% under the clip is covered by solder.

This is important to obtain a low $R_{DS(on)}$, a high power efficiency, and a good interconnect from the source pad to a lead frame.

However, it is challenging to control the solder bleed out and at the same time ensure the good solder coverage under the clip. Excessive solder bleed out may contaminate the bond pad, which may lead to a short in a case where the bled-out solder reaches additional bond pads (contacts) and may result in nonstick-on-pad during wire bonding.

In the prior art, a clearance between the clip and the additional bond pads is provided in order to prevent that the bled-out solder reaches the additional bond pads.

However, this may have the disadvantage that the chip size is increased.

Reducing instead the clip size results in high $R_{DS(on)}$, worse chip cooling via the clip, worse performance regarding a safe operating area (SOA), and a reduced cost effectiveness.

SUMMARY

A semiconductor device is provided. The semiconductor device may include a semiconductor substrate including an active area, a metal layer structure over the active area, wherein the metal layer structure is configured to form an electrical contact, the metal layer structure including a solder area, a buffer area, and a barrier area between the solder area and the buffer area, wherein, in the barrier area, the metal layer structure is further away from the active area than in the solder area and in the buffer area, and wherein each of the solder area and the buffer area is in direct contact with the active area or with a wiring layer structure arranged between the active area and the metal layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
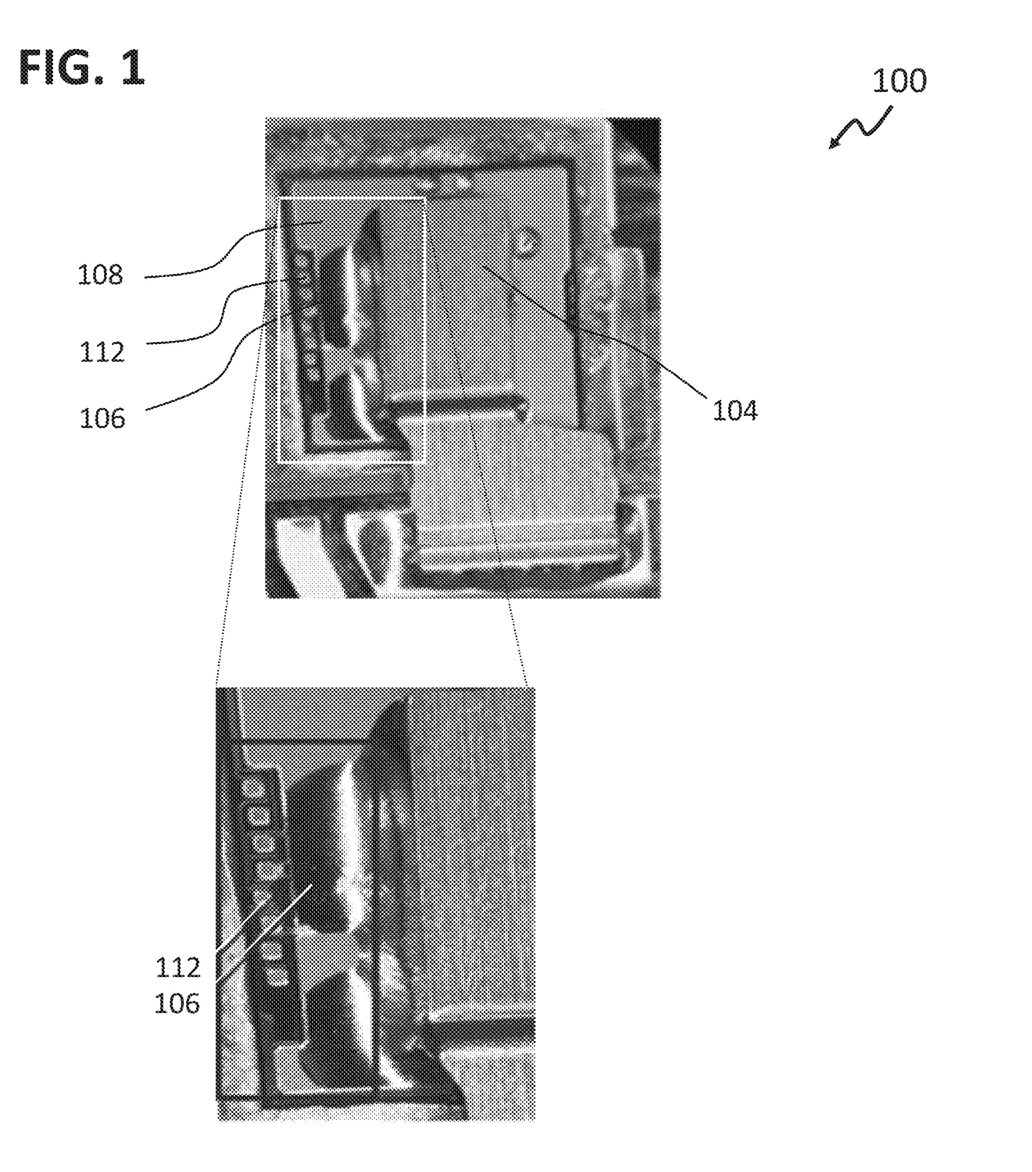
FIG. 1 shows a semiconductor device according to a state of the art.

As shown in FIG. 1, in a semiconductor device 100 according to a state of the art, e.g. in a transistor, a metal clip 104 may be soldered to a metal layer structure 108, wherein the metal layer structure 108 is configured as an electrical contact. During the soldering process, solder 106 may bleed out from underneath the clip 104. The bled-out solder 106 can for example be seen mostly to the left of the clip 104. Also in the zoomed-in view at the bottom, a large portion of solder is arranged to the left of the clip 104. The bled-out solder 106 may lead to several undesired effects caused on the one hand by a lack of solder 106 in a gap between the clip 104 and the metal layer structure 108, and on the other hand by an excess of solder 106 outside the gap. The solder may be a solder metal or a solder metal paste. By way of example, the solder may be lead free or may include lead. The solder may include or essentially consist of one or more of the following materials: SnAg and/or Pb and/or SnAgSb.

Regarding the excess of solder 106 outside the gap, the solder bleed-out may reach bond pads 112 that form further electrical contacts and are located near the metal layer structure 108. The bled-out solder 106 may thereby form a short contact between the metal layer structure 108 and one or more of the bond pads 112. Even if the solder 106 does not completely reach the bond pads 112, the liquid solder 106 may release contaminants, which may settle on the nearby bond pads 112. The contaminated bond pads 112 may be less adhesive during a wire bonding process than uncontaminated bond pads 112, which may lead to a so-called "non-stick on pad" during the wire bonding. In other words, wires contacted to the bond pads, for example as shown in the bottom image of FIG. 1, may easily lose contact to the bond pads 112, such that a reliability of the semiconductor device 100 may suffer.

Furthermore, the excess solder 106 on the metal layer structure 108 may reduce an adhesiveness to a packaging material, e.g. a mold (not shown) that may be arranged on the metal layer structure 108 and the clip 104.

In various embodiments, a barrier area is formed in a semiconductor device. The barrier structure is configured to confine solder, which may be used for soldering a contact structure, e.g. a clip, to a metal layer structure (that is configured as an electrical contact of the semiconductor device), to a solder area, in other words, to form a solder reservoir. Thereby, it may on the one hand be ensured that enough solder remains in the solder area to be sure that more than 80% of the contact structure (the clip) solder surface are covered by the solder, and on the other hand, it may be ensured that none or only a small quantity of the solder gets spilled over the barrier area towards a buffer area. The solder area, the barrier area and the buffer area may all be covered by the metal layer structure, and in the barrier area, the metal layer structure may be further away from a semiconductor substrate that is part of the semiconductor device and in or on which an active region is formed. The active region may be covered by the metal layer structure.

In other words, a barrier base structure is included in the semiconductor device in order to form a solder reservoir for a solder bleed-out control.

The barrier structure may be formed by arranging a barrier base structure on or over the semiconductor substrate and by arranging the metal layer structure over the semiconductor substrate, and over the barrier base structure.

Figure 2A:
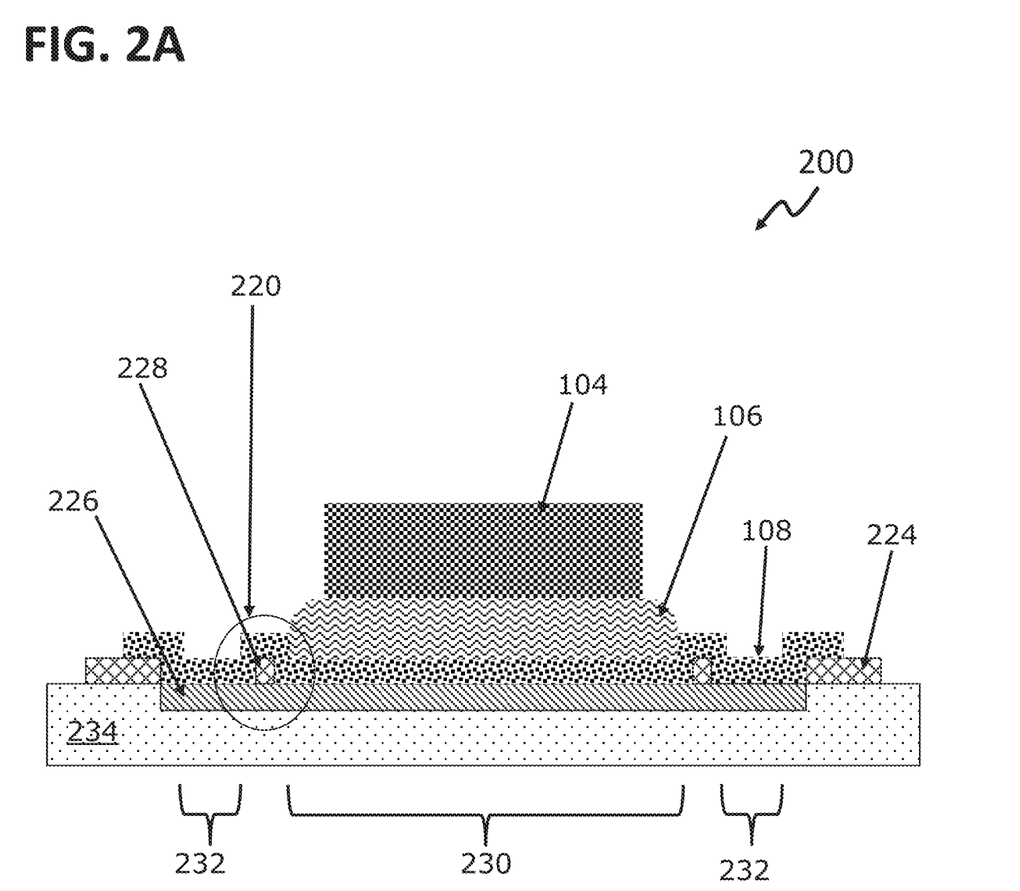
FIGS. 2A to 2C each show a schematic cross-sectional view of a semiconductor device in accordance with various embodiments.
Figure 2B:
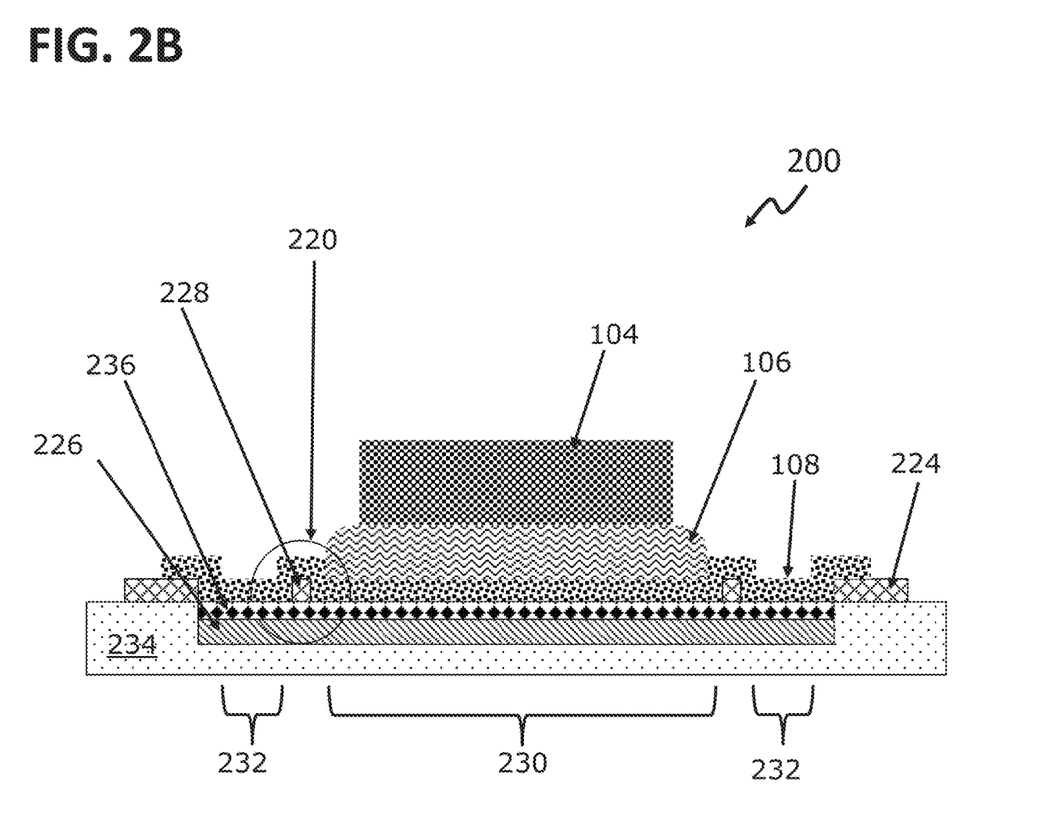
Figure 2C:
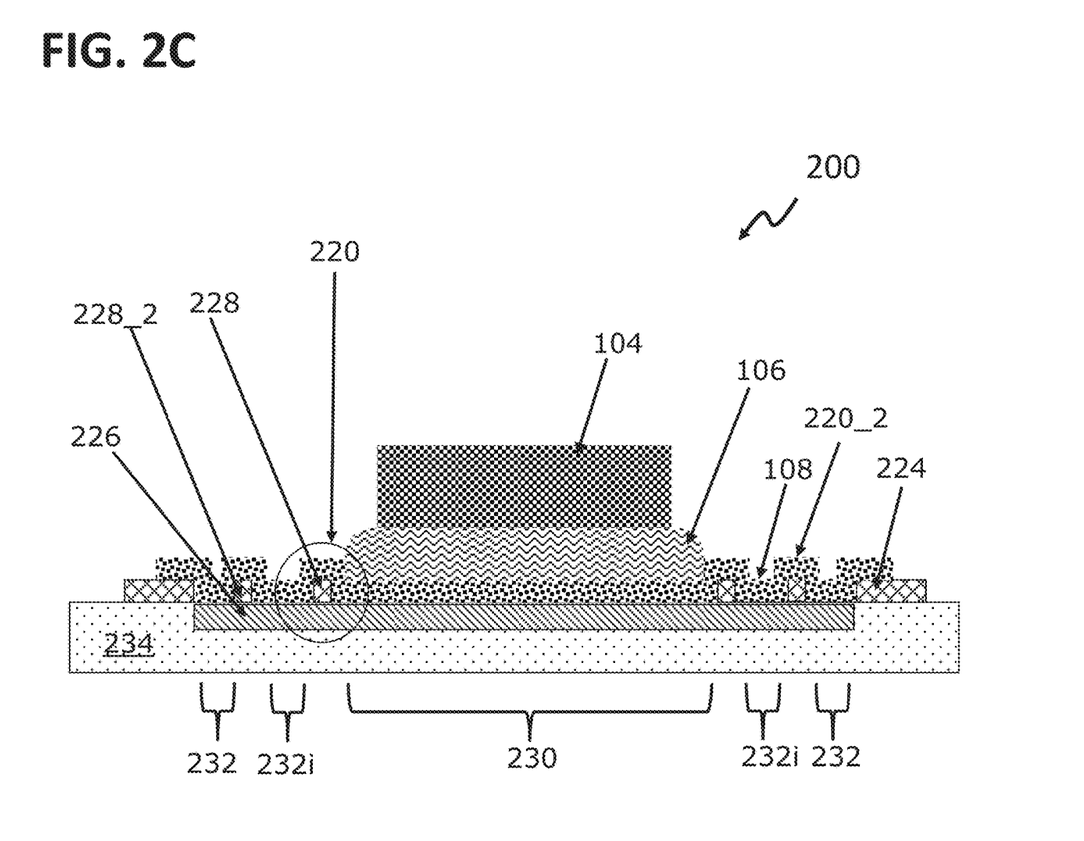
Figure 3:
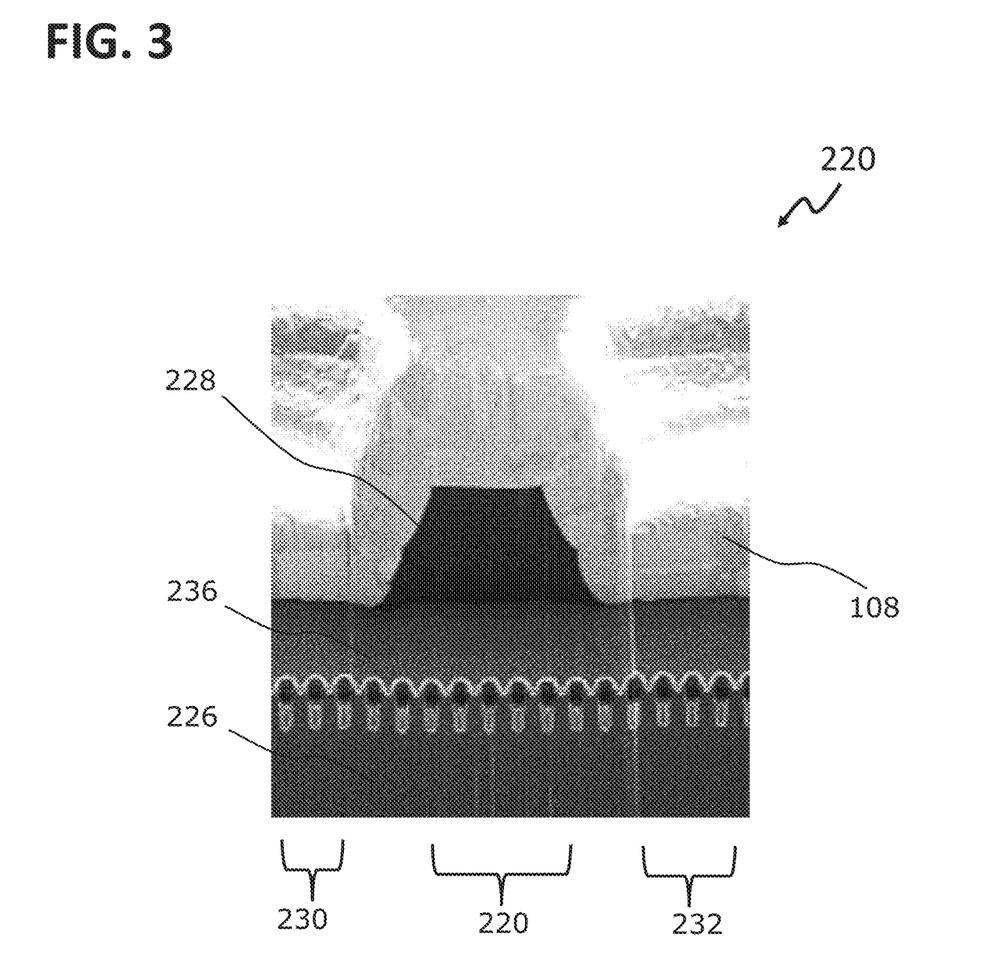
FIG. 3 shows a zoomed-in view of a barrier structure of a semiconductor device in accordance with various embodiments.
Figure 4:
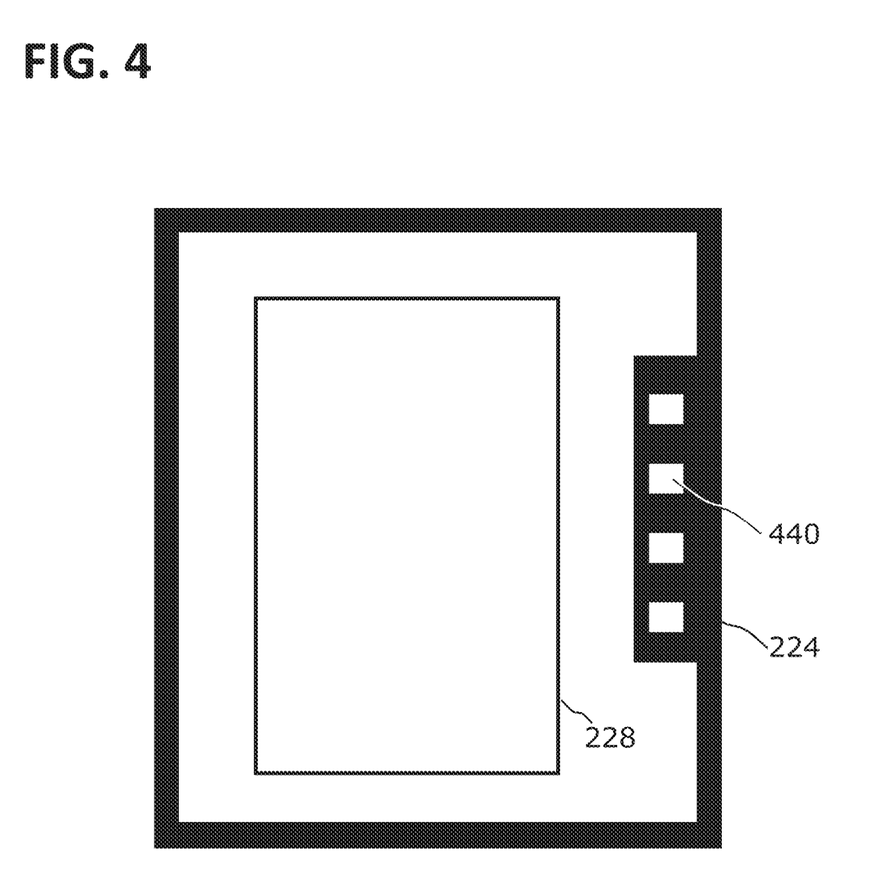
FIG. 4 shows a schematic top view of a passivation layer of a semiconductor device in accordance with various embodiments.
Figure 5A:
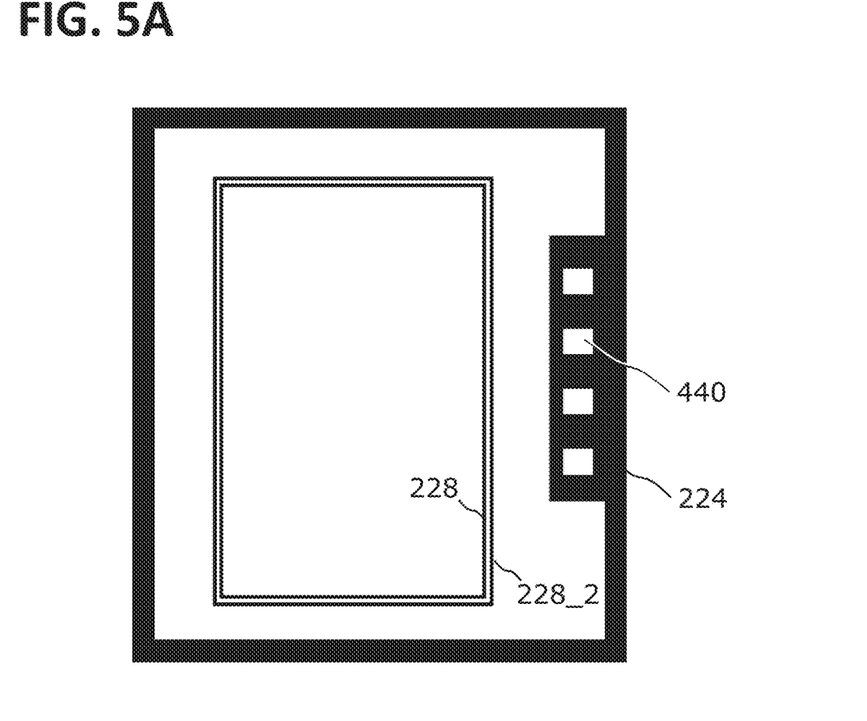
FIG. 5A and FIG. 5B each show a schematic top view of a passivation layer of a semiconductor device in accordance with various embodiments.
Figure 5B:
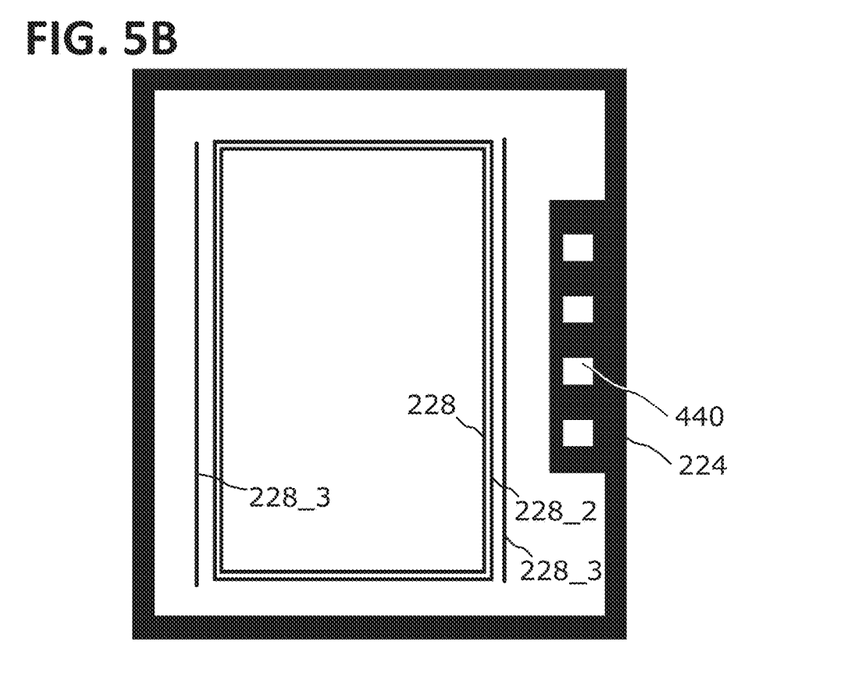

FIGS. 2A to 2C each show a schematic cross-sectional view of a semiconductor device 200 in accordance with various embodiments, FIG. 3 shows a zoomed-in view of a barrier structure 220 of a semiconductor device 200 in accordance with various embodiments, FIG. 4 shows a schematic top view of a passivation layer of a semiconductor device 200 in accordance with various embodiments, and FIG. 5A and FIG. 5B each show a schematic top view of a passivation layer of a semiconductor device 200 in accordance with various embodiments.

The semiconductor device 200 may in various embodiments include a metal layer structure 108 formed over a semiconductor substrate 234. The semiconductor device 200 may include an active area 226 of the device. The active area 226 may be exposed on a first surface (e.g. top surface, e.g. in FIG. 2A and FIG. 2C) of the semiconductor substrate 234, or it may be covered by, e.g., a wiring layer structure 236 (see FIG. 2B).

The active area 226 may be covered by the metal layer structure 108. The metal layer structure 108 may be a single metal layer 108 or a metal layer stack 108 including a plurality of metal layers. The metal of the metal layer structure may include or consist of any metal or combination of metals typically used for forming an electrical contact and suitable for the semiconductor device 200, for example copper, a copper alloy, a copper-chromium alloy, gold, aluminum, nickel, a nickel alloy, titanium, a titanium alloy, tungsten, a tungsten alloy, and/or a titanium-tungsten alloy. The metal layer structure 108 may have a thickness in a range from about 100 nm to about 100 µm, e.g. in a range from about 1 µm to about 10 µm, e.g. about 5 µm.

The metal layer structure 108 and, if applicable, the wiring layer structure 236, may be formed as known in the art, e.g. by a deposition process, e.g. a vapor deposition process, a plating process or the like. Masks, e.g. using a photolithographic masking process, may be used for a structuring of the metal layer structure 108 and, if applicable, the wiring layer structure 236.

The wiring layer structure 236 may be a single metal layer 236 or a metal layer stack 236 including a plurality of metal layers. The wiring layer structure 236 may include or consist of any metal or combination of metals typically used for forming a wiring layer structure 236 and suitable for the semiconductor device 200, for example copper, gold, aluminum, nickel, a nickel alloy, palladium, a palladium alloy, and/or a nickel-palladium alloy.

The semiconductor device 200 may for example forms a discrete electronic component, e.g. a diode, a thyristor, a MOSFET, a CoolMOS, and an IGBT. The semiconductor device 200 may for example form a power electronic component. The semiconductor device 200 may be configured to have a current flow in a vertical direction through the semiconductor device 200.

The metal layer structure 108 may be configured to form an electrical contact (e.g. a source contact) of the semiconductor device 200.

The metal layer structure 108 may include a solder area 230, a buffer area 232, and a barrier area 220 between the solder area 230 and the buffer area 232.

The solder area 230, the buffer area 232 and the barrier area 220 may be formed as one continuous metal layer structure 108 and may be differentiated by their relative positions, their shapes, and/or by their functionality, as described in the following.

Each of the solder area 230 and the buffer area 232 may be in direct contact with the active area 226 or with the wiring layer structure 236 arranged between the active area and the metal layer structure 108. In other words, the metal layer structure 108 may be arranged to cover the active area 226, such that an electrical contact to the active area 226 (direct contact or indirect contact through the wiring layer 236) provided by the metal layer structure 108 extends over the whole area of the active area 226 in order to ensure a high efficiency.

In the barrier area 220, the metal layer structure 108 may be further away from the active area 226 than in the solder area 230 and in the buffer area 232. In the barrier area 220, the metal layer structure 108 may be arranged over a barrier base structure 228. In other words, the barrier base structure 228 may be formed over the semiconductor substrate 234, e.g. on the active area 226 or on the wiring layer 236, and the metal layer structure 108 may be formed over it (and the remaining portions of the active area 226 or the wiring layer 236, respectively).

The barrier base structure 228 may be a single barrier base layer or a barrier base layer stack including a plurality of barrier base layers. The barrier base structure 228 may be formed as known in the art, e.g. by a deposition process, e.g. a vapor deposition process, a plating process or the like. Masks, e.g. using a photolithographic masking process, may be used for a structuring of the barrier base structure 228.

In various embodiments, the barrier base structure 228 may include or consist of a dielectric material, e.g. an imide, an oxide, and/or a nitride. This may be advantageous in a case that the semiconductor device 200 includes a passivation layer 224 over, e.g. on, the semiconductor substrate 234 outside the active area 226 (or, respectively, outside the wiring layer 236). In that case, a material of the passivation layer 224 may be selected to be the same as the dielectric material of the barrier base structure 228 (or vice versa), which means that the passivation layer 224 and the barrier base structure 228 may be formed simultaneously. In other words, in this case, no additional (with respect to a process of forming the state of the art semiconductor device 100) processing step may be required for forming the barrier base structure 228. Instead, only a mask for forming the passivation layer 224 may be modified to form also the barrier base structure 228.

In various embodiments, the barrier base structure 228 may include or consist of a metal, for example copper, a copper alloy, a copper-chromium alloy, gold, aluminum, nickel, a nickel alloy, titanium, a titanium alloy, tungsten, a tungsten alloy, and/or a titanium-tungsten alloy. Thereby, a direct electrically conductive contact may also be provided between the barrier area 220 and the active area 226 (or the wiring layer structure 236, respectively). The metal of the barrier base structure 228 may in various embodiments be the same as the metal of the metal layer structure 220. In a case of the metal layer structure 220 forming the layer stack, the metal of the barrier base structure 228 may be the same as the layer of the metal layer structure 220 directly contacting the barrier base structure 228.

In various embodiments, the barrier base structure 228 may include a mixture of one or more metal layer(s) and one or more dielectric layer(s).

A height of the barrier base structure 228 may in various embodiments be in a range from about 3 µm to about 100 µm, e.g. from about 10 µm to about 50 µm, e.g. about 25 µm. A width of the barrier base structure 228 may be in a range from about 2 µm to about 25 µm, e.g. from about 5 µm to about 20 µm, e.g. about 13 µm. In various embodiments, the width of the barrier base structure 228 may be larger than its height. The width of the barrier base structure 228 may be determined by technological limitations, e.g. of a lithography process. For example, using an imide for the barrier base structure 228, a width of 10 µm may be achieved for the barrier base structure 228 having a thickness of 6 µm.

The semiconductor device 200 may further include one or more further electrical contacts like the further electrical contact(s) 112 shown in FIG. 1. Their respective positions are indicated in each of FIG. 4, FIG. 5A and FIG. 5B by four passivation layer free areas 440 enclosed by the passivation layer 224. The barrier area may (at least) be arranged between the solder area 230 and the further electrical contact(s) 112. Thereby, it may be prevented or at least alleviated that solder flows towards the further electrical contact(s) 112 during the soldering process. Thus, a short between the contact provided by the metal layer structure 108 and the further electrical contact(s) 112 may be avoided, and also a contamination of the further electrical contact(s) 112 may be avoided or at least alleviated.

This means that, in various embodiments, a solder 106 coverage under the clip 104 may be optimized to ensure low product $R_{DS(on)}$ and a high power efficiency. This will help to prevent a reliability issue of a lifted wire-on-pad during or after the clip 104 attach due to a bond pad 112 contamination by the solder 106.

To form the barrier area just between the solder area 230 and the further electrical contact(s) 112, the barrier base structure 228 may for example be shaped as a continuous wall or as an interrupted wall between the solder area 230 and the further electrical contact(s) 112.

In various embodiments, the barrier base structure 228 may be formed to encircle the solder area 230. Thereby, a capability to confine the solder 106 to the solder area 230 (i.e., to form a solder 106 reservoir), and thereby to avoid voids between the metal layer structure 108 and a solder portion of a metal contact structure 104 (which is soldered to or configured to be soldered to the metal layer structure 108), may be improved.

The encircling barrier base structure 228 may be ring-shaped in the sense that it forms a structure that is closed upon itself. Its shape may for example be a circular, elliptical or polygonal (e.g. rectangular, e.g. square, e.g. with chamfered corners) ring.

The ring-shaped barrier base structure 228 may be shaped as a continuous or as an interrupted ring.

In various embodiments, the barrier base structure 228 may have any other shape that may improve a confinement of the solder 106 to the solder area 230 and/or help prevent a contamination of the buffer area 232 and/or of the further contact(s) 112, for example an L-shaped structure, a U-shaped structure, one wall each on two opposite sides of the solder area 230, or the like.

The reduced or avoided contamination of the buffer area 232 and/or of the further contact(s) 112 may improve an quality of contact between bond wires 116 (see FIG. 1) and the further contact(s) 112, and also improve an adhesion of packaging material (not shown) to the buffer area 232, and avoid or alleviate a dendrite growth outside the solder area 230.

The interrupted barrier base structure 228 (interrupted wall, ring, L-shaped/U-shaped structure or the like) may in various embodiments be formed in such a way that a distance between adjacent barrier base structure sections is such that they get filled by the metal layer structure 108 when it is formed over the barrier base structure 228, in other words with a distance of approximately twice a thickness of the metal layer structure 108. or with a distance. In a case of arranging the barrier base structure segments with a larger distance, the distance may be small enough such that the solder 106 nevertheless remains on the solder area 230.

In various embodiments, as for example shown in FIG. 5A and FIG. 5B, the barrier base structure 228 may be formed as a double barrier base structure 228, 228_2. In other words, the metal layer structure 108 may include a further barrier area 220_2 between the barrier area 220 and the buffer area 232. An area of the metal layer structure 108 between the barrier area 220 and the further barrier area 220_2 may be considered an intermediate buffer area 232i (see FIG. 2C).

In various embodiments, the further barrier area 220_2 may be formed to encircle or partially encircle the barrier area 220.

A distance between the barrier area 220 and the further barrier area 220_2 (and, correspondingly, between the barrier base structure 228 and the further barrier base structure 228_2) may be in a range from about 20 µm to about 100 µm, e.g. about 30 µm.

In various embodiments, more than two barrier areas may be provided, e.g. three or more barrier areas. See for example FIG. 5B, where wall-shaped barrier base structures 228_3 are formed on two sides outside the rectangular double barrier base structure 228, 228_2.

The zoomed image in FIG. 3 shows a cross-sectional view of the barrier area 220 (copper) with the barrier base structure 228 (imide) underneath. Below the barrier base structure 228 and the metal layer structure 108, a wiring layer 236 (AlCu) is arranged on the active area 226. In a transition region rising from the solder area 230 to the barrier area 220, the metal layer structure 108 may be arranged with an angle of between approximately vertical and approximately 60° from vertical, and symmetrically in the transition region rising from the buffer area 232 to the barrier area 220. This means that the barrier base structure 228 may be formed with an outline that results in the described arrangement of the metal layer structure 108. In general, the barrier base structure 228 may be formed with side walls as steep as possible while still ensuring an uninterrupted coverage of the base barrier structure 228 with the metal layer structure 108. The further base barrier structure 228_2 may be formed with a similar shape.

As described above, the semiconductor device 200 may include the metal contact structure 104, e.g. a metal clip, having a solder portion soldered to the solder area 230 of the metal layer structure 108. The metal clip 104 may have a width in a range from about 1 mm to about 2 mm, and a height in a range from about 3 mm to about 5 mm.

In various embodiments, lateral dimensions of the solder area 230 may be configured to essentially match lateral dimensions of the solder portion. For example, a width and a length of an area encircled by the inner barrier base structure 228, which essentially (except for the metal layer structure 108 to be arranged over the barrier base structure 228) corresponds in dimensions to the solder area 230, may be just slightly larger (e.g. by about 5% to about 10% in each dimension) than the solder portion of the metal contact structure 104. In other words, the barrier area 220 may be formed laterally outside the metal contact structure 104, e.g. the clip.

In various embodiments, the barrier area 220 may be arranged in such a way that it has the same or approximately the same distance to opposite edges of the metal layer structure 108.

In various embodiments, the semiconductor device 200 may include a plurality of active regions 226 (in other words, a plurality of semiconductor components) and plurality of metal contact structures (e.g. clips), wherein each of the semiconductor components may be provided with its own barrier structure 220.

Figure 6:
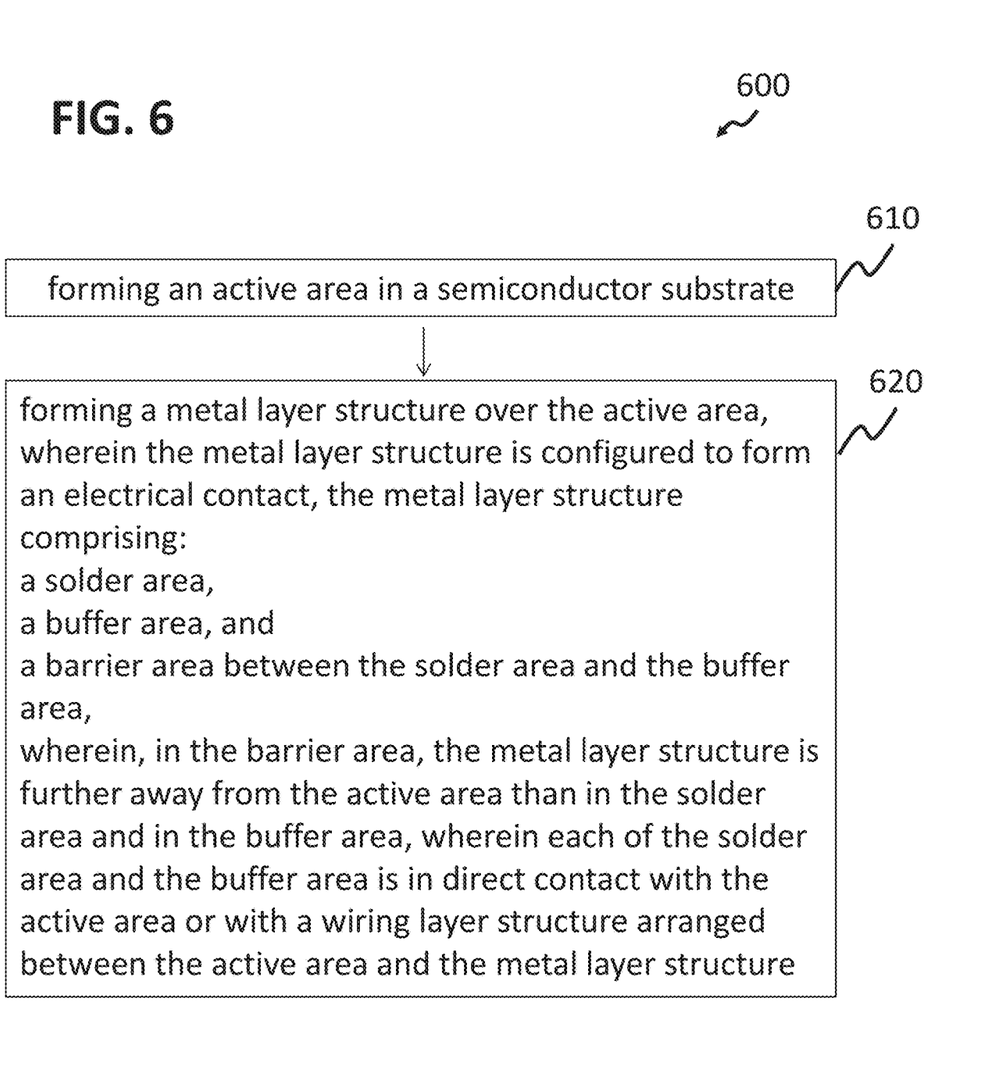
FIG. 6 shows a flow diagram of a method of forming a semiconductor device in accordance with various embodiments.

FIG. 6 shows a flow diagram 600 of a method of forming a semiconductor device in accordance with various embodiments.

The method may include forming an active area in a semiconductor substrate (in 610) and forming a metal layer structure over the active area, wherein the metal layer structure is configured to form an electrical contact, the metal layer structure including a solder area, a buffer area, and a barrier area between the solder area and the buffer area, wherein, in the barrier area, the metal layer structure is further away from the active area than in the solder area and in the buffer area, wherein each of the solder area and the buffer area is in direct contact with the active area or with a wiring layer structure arranged between the active area and the metal layer structure (in 620).

Various examples will be illustrated in the following:

Example 1 is a semiconductor device. The semiconductor device may include a semiconductor substrate including an active area, a metal layer structure over the active area, wherein the metal layer structure is configured to form an electrical contact, the metal layer structure including a solder area, a buffer area, and a barrier area between the solder area and the buffer area, wherein, in the barrier area, the metal layer structure is further away from the active area than in the solder area and in the buffer area, and wherein each of the solder area and the buffer area is in direct contact with the active area or with a wiring layer structure arranged between the active area and the metal layer structure.

In Example 2, the subject-matter of Example 1 may optionally include that, in the barrier area, the metal layer structure is arranged over a barrier base structure.

In Example 3, the subject-matter of Example 1 or 2 may optionally include that the barrier base structure is a single barrier base layer or a barrier base layer stack including a plurality of barrier base layers.

In Example 4, the subject-matter of Example 2 or 3 may optionally include that the barrier base structure includes or consists of a dielectric material.

In Example 5, the subject-matter of Example 4 may optionally include that the dielectric material of the barrier base structure includes or consists of at least one material of a group of dielectric materials, the group consisting of an imide, an oxide, and a nitride.

In Example 6, the subject-matter of any of Examples 3 to 5 may further optionally include a passivation layer over the semiconductor substrate outside the active area.

In Example 7, the subject-matter of Example 6 may optionally include that a material of the passivation layer is the same as the dielectric material of the barrier base structure.

In Example 8, the subject-matter of Example 6 or of Example 7 may optionally include that the passivation layer and the barrier base structure are formed simultaneously.

In Example 9, the subject-matter of Example 2 may optionally include that the barrier base structure includes or consists of a metal.

In Example 10, the subject-matter of Example 9 may optionally include that the metal of the barrier base structure is the same as the metal of the metal layer structure.

In Example 11, the subject-matter of any of Examples 1 to 10 may further optionally include a further electrical contact, wherein the barrier area is arranged between the solder area and the further electrical contact.

In Example 12, the subject-matter of any of Examples 2 to 11 may optionally include that the barrier base structure is formed to encircle the solder area.

In Example 13, the subject-matter of any of Examples 2 to 12 may optionally include that the barrier base structure is formed as a circular, elliptical or polygonal ring.

In Example 14, the subject-matter of any of Examples 2 to 13 may optionally include that the barrier base structure is shaped as an interrupted ring.

In Example 15, the subject-matter of any of Examples 2 to 14 may optionally include that the barrier base structure is shaped as a continuous ring.

In Example 16, the subject-matter of any of Examples 1 to 15 may further optionally include a further barrier area between the barrier area and the buffer area.

In Example 17, the subject-matter of Example 16 may optionally include that the further barrier area is formed to encircle or partially encircle the barrier area.

In Example 18, the subject-matter of any of Examples 1 to 17 may optionally include that the metal layer structure is a single metal layer or a metal layer stack including a plurality of metal layers.

In Example 19, the subject-matter of any of Examples 1 to 18 may optionally include that the metal of the metal layer structure includes at least one metal or metal alloy of a group of metals and metal alloys consisting of copper, a copper alloy, a copper-chromium alloy, gold, aluminum, nickel, a nickel alloy, titanium, a titanium alloy, tungsten, a tungsten alloy, and a titanium-tungsten alloy.

In Example 20, the subject-matter of any of Examples 1 to 19 may optionally include that the wiring layer structure is a single metal layer or a metal layer stack including a plurality of metal layers.

In Example 21, the subject-matter of any of Examples 1 to 20 may optionally include that the wiring layer structure includes at least one metal or metal alloy of a group of metals and metal alloys consisting of copper, gold, aluminum, nickel, a nickel alloy, palladium, a palladium alloy, and a nickel-palladium alloy.

In Example 22, the subject-matter of any of Examples 1 to 21 may optionally include that, in a transition region rising from the solder area to the barrier area, the metal layer structure is arranged with an angle of between approximately vertical and approximately 60° from vertical.

In Example 23, the subject-matter of any of Examples 1 to 22 may further optionally include a metal contact structure having a solder portion soldered to the solder area, wherein lateral dimensions of the solder area are configured to essentially match lateral dimensions of the solder portion.

In Example 24, the subject-matter of Example 23 may optionally include that the metal contact structure is a metal clip.

In Example 25, the subject-matter of Example 24 may optionally include that the metal clip overlaps the entire surface of the solder area.

In Example 26, the subject-matter of any of Examples 1 to 25 may optionally include that the semiconductor device forms a discrete electronic component.

In Example 27, the subject-matter of any of Examples 1 to 26 may optionally include that the semiconductor device forms one of a group of electronic components, the group consisting of a diode, a thyristor, a MOSFET, a CoolMOS, and an IGBT.

In Example 28, the subject-matter of any of Examples 1 to 27 may optionally include that the semiconductor device forms a power electronic component.

In Example 29, the subject-matter of any of Examples 1 to 28 may optionally include that the semiconductor device is configured to have a current flow in a vertical direction through the semiconductor device.

In Example 30, the subject-matter of any of Examples 2 to 29 may optionally include that a height of the barrier base structure is in a range from 3 µm to 100 µm.

Example 31 is a method of forming a semiconductor device. The method may include forming an active area in a semiconductor substrate, forming a metal layer structure over the active area, wherein the metal layer structure is configured to form an electrical contact, the metal layer structure including a solder area, a buffer area, and a barrier area between the solder area and the buffer area, wherein, in the barrier area, the metal layer structure is further away from the active area than in the solder area and in the buffer area, wherein each of the solder area and the buffer area is in direct contact with the active area or with a wiring layer structure arranged between the active area and the metal layer structure.

In Example 32, the subject-matter of Example 31 may further optionally include, before the forming the metal layer structure, forming a barrier base structure over the active area, wherein the forming the metal layer structure includes arranging, in the barrier area, the metal layer structure over the barrier base structure.

In Example 33, the subject-matter of Example 32 may optionally include that the barrier base structure includes or consists of a dielectric material.

In Example 34, the subject-matter of Example 33 may optionally include that the dielectric material of the barrier base structure includes or consists of at least one material of a group of dielectric materials, the group consisting of an imide, an oxide, and a nitride.

In Example 35, the subject-matter of Example 33 or 34 may further optionally include, simultaneously with the forming a barrier base structure, forming a passivation layer over the semiconductor substrate outside the active area.

In Example 36, the subject-matter of Example 35 may optionally include that a material of the passivation layer is the same as the dielectric material of the barrier base structure.

In Example 37, the subject-matter of Example 32 may optionally include that the barrier base structure includes or consists of a metal.

In Example 38, the subject-matter of Example 37 may optionally include that the metal of the barrier base structure is the same as the metal of the metal layer structure.

In Example 39, the subject-matter of any of Examples 31 to 38 may further optionally include soldering a solder portion of a metal contact structure to the solder area.

In Example 40, the subject-matter of Example 39 may optionally include that lateral dimensions of the solder area are configured to essentially match lateral dimensions of the solder portion.

In Example 41, the subject-matter of any of Examples 31 to 40 may optionally include that the barrier base structure is a single barrier base layer or a barrier base layer stack including a plurality of barrier base layers.

In Example 42, the subject-matter of any of Examples 31 to 41 may further optionally include a further electrical contact, wherein the barrier area is arranged between the solder area and the further electrical contact.

In Example 43, the subject-matter of any of Examples 32 to 42 may optionally include that the barrier base structure is formed to encircle the solder area.

In Example 44, the subject-matter of any of Examples 31 to 43 may optionally include that the barrier base structure is formed as a circular, elliptical or polygonal ring.

In Example 45, the subject-matter of any of Examples 32 to 44 may optionally include that the barrier base structure is shaped as an interrupted ring.

In Example 46, the subject-matter of any of Examples 32 to 45 may optionally include that the barrier base structure is shaped as a continuous ring.

In Example 47, the subject-matter of any of Examples 31 to 46 may further optionally include a further barrier area between the barrier area and the buffer area.

In Example 48, the subject-matter of Example 47 may optionally include that the further barrier area is formed to encircle or partially encircle the barrier area.

In Example 49, the subject-matter of any of Examples 31 to 48 may optionally include that the metal layer structure is a single metal layer or a metal layer stack including a plurality of metal layers.

In Example 50, the subject-matter of any of Examples 31 to 49 may optionally include that the metal of the metal layer structure includes at least one metal or metal alloy of a group of metals and metal alloys consisting of copper, a copper alloy, a copper-chromium alloy, gold, aluminum, nickel, a nickel alloy, titanium, a titanium alloy, tungsten, a tungsten alloy, and a titanium-tungsten alloy.

In Example 51, the subject-matter of any of Examples 31 to 50 may optionally include that the wiring layer structure is a single metal layer or a metal layer stack including a plurality of metal layers.

In Example 52, the subject-matter of any of Examples 31 to 51 may optionally include that the wiring layer structure includes at least one metal or metal alloy of a group of metals and metal alloys consisting of copper, gold, aluminum, nickel, a nickel alloy, palladium, a palladium alloy, and a nickel-palladium alloy.

In Example 53, the subject-matter of any of Examples 31 to 52 may optionally include that, in a transition region rising from the solder area to the barrier area, the metal layer structure is arranged with an angle of between approximately vertical and approximately 60° from vertical.

In Example 54, the subject-matter of any of Examples 39 to 53 may optionally include that the metal contact structure is a metal clip.

In Example 55, the subject-matter of any of Examples 31 to 54 may optionally include that the semiconductor device forms a discrete electronic component.

In Example 56, the subject-matter of any of Examples 31 to 55 may optionally include that the semiconductor device forms one of a group of electronic components, the group consisting of a diode, a thyristor, a MOSFET, a CoolMOS, and an IGBT.

In Example 57, the subject-matter of any of Examples 31 to 56 may optionally include that the semiconductor device forms a power electronic component.

In Example 58, the subject-matter of any of Examples 31 to 57 may optionally include that the semiconductor device is configured to have a current flow in a vertical direction through the semiconductor device.

In Example 59, the subject-matter of any of Examples 32 to 58 may optionally include that a height of the barrier base structure is in a range from 3 µm to 100 µm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device comprising:
   a semiconductor substrate comprising an active area;
   a metal layer structure over the active area, wherein the metal layer structure is configured to form an electrical contact, the metal layer structure comprising:
   a solder area,
   a buffer area,
   a barrier area between the solder area and the buffer area,
   wherein, in the barrier area, the metal layer structure is arranged over a barrier base structure comprising or consisting of a dielectric material; and
   a passivation layer formed simultaneously with the barrier base structure over the semiconductor substrate outside the active area,
   wherein a material of the passivation layer is the same as the dielectric material of the barrier base structure,
   wherein, in the barrier area, the metal layer structure is further away from the active area than in the solder area and in the buffer area; and
   wherein each of the solder area and the buffer area is in direct contact with the active area or with a wiring layer structure arranged between the active area and the metal layer structure.

2. The semiconductor device of claim 1,
   wherein the barrier base structure is a single barrier base layer or a barrier base layer stack comprising a plurality of barrier base layers.

3. The semiconductor device of claim 1,
   wherein the dielectric material of the barrier base structure comprises or consists of at least one material of a group of dielectric materials, the group consisting of:
   an imide;
   an oxide; and
   a nitride.

4. The semiconductor device of claim 1,
   wherein the barrier base structure comprises a metal.

5. The semiconductor device of claim 4,
   wherein the metal of the barrier base structure is the same as the metal of the metal layer structure.

6. The semiconductor device of claim 1, further comprising:
   a further electrical contact,
   wherein the barrier area is arranged between the solder area and the further electrical contact.

7. The semiconductor device of claim 1,
   wherein the barrier base structure is formed to encircle the solder area.

8. The semiconductor device of claim 1,
   wherein the barrier base structure is formed as a circular, elliptical or polygonal ring.

9. The semiconductor device of claim 1,
   wherein the barrier base structure is shaped as an interrupted ring.

10. The semiconductor device of claim 1,
    wherein the barrier base structure is shaped as a continuous ring.

11. The semiconductor device of claim 1, further comprising:
    a further barrier area between the barrier area and the buffer area.

12. The semiconductor device of claim 11,
    wherein the further barrier area is formed to encircle the barrier area.

13. The semiconductor device of claim 1,
    wherein the metal layer structure is a single metal layer or a metal layer stack comprising a plurality of metal layers.

14. The semiconductor device of claim 1,
    wherein the metal of the metal layer structure comprises at least one metal or metal alloy of a group of metals and metal alloys consisting of:
    copper;
    a copper alloy;
    a copper-chromium alloy;
    gold;
    aluminum;
    nickel;
    a nickel alloy;
    titanium;
    a titanium alloy;
    tungsten
    a tungsten alloy; and
    a titanium-tungsten alloy.

15. The semiconductor device of claim 1,
    wherein the wiring layer structure is a single metal layer or a metal layer stack comprising a plurality of metal layers.

16. The semiconductor device of claim 1,
    wherein the wiring layer structure comprises at least one metal or metal alloy of a group of metals and metal alloys consisting of:

copper;
aluminum,
tungsten,
titanium,
nickel;
a nickel alloy;
palladium;
a palladium alloy;
a nickel-palladium alloy.

17. The semiconductor device of claim 1, wherein, in a transition region rising from the solder area to the barrier area, the metal layer structure is arranged with an angle of between approximately vertical and approximately 60° from vertical.

18. The semiconductor device of claim 1, further comprising:
a metal contact structure having a solder portion soldered to the solder area,
wherein lateral dimensions of the solder area are configured to essentially match lateral dimensions of the solder portion.

19. The semiconductor device of claim 18, wherein the metal contact structure is a metal clip.

20. The semiconductor device of claim 19, wherein the metal clip overlaps the entire surface of the solder area.

21. The semiconductor device of claim 1, wherein the semiconductor device forms a discrete electronic component.

22. The semiconductor device of claim 1, wherein the semiconductor device forms one of a group of electronic components, the group consisting of:
a diode,
a thyristor,
a MOSFET,
a CoolMOS, and
an IGBT.

23. The semiconductor device of claim 1, wherein the semiconductor device forms a power electronic component.

24. The semiconductor device of claim 1, wherein the semiconductor device is configured to have a current flow in a vertical direction through the semiconductor device.

25. The semiconductor device of claim 1, wherein a height of the barrier base structure is in a range from 3 μm to 100 μm.

26. A method of forming a semiconductor device, the method comprising:
forming an active area in a semiconductor substrate;
forming a barrier base structure over the active area;
simultaneously with the forming a barrier base structure, forming a passivation layer over the semiconductor substrate outside the active area;
forming a metal layer structure over the active area, wherein the metal layer structure is configured to form an electrical contact, and wherein the forming the metal layer structure comprises arranging, in the barrier area, the metal layer structure over the barrier base structure, the metal layer structure comprising:
a solder area,
a buffer area, and
a barrier area between the solder area and the buffer area,
wherein, in the barrier area, the metal layer structure is further away from the active area than in the solder area and in the buffer area;
wherein each of the solder area and the buffer area is in direct contact with the active area or with a wiring layer structure arranged between the active area and the metal layer structure.

27. The method of claim 26, wherein the barrier base structure comprises or consists of a dielectric material.

28. The method of claim 26, wherein the barrier base structure comprises a metal.

29. The method of claim 28, wherein the metal of the barrier base structure is the same as the metal of the metal layer structure.

30. The method of claim 26, further comprising:
soldering a solder portion of a metal contact structure to the solder area,
wherein lateral dimensions of the solder area are configured to essentially match lateral dimensions of the solder portion.

* * * * *